(12) United States Patent
Chengson

(10) Patent No.: US 6,538,518 B1
(45) Date of Patent: Mar. 25, 2003

(54) MULTI-LOOP PHASE LOCK LOOP FOR CONTROLLING JITTER IN A HIGH FREQUENCY REDUNDANT SYSTEM

(75) Inventor: David Chengson, Scotts Valley, CA (US)

(73) Assignee: Juniper Networks, Inc., Sunnyvale, CA (US)

(*) Notice: Subject to any disclaimer, the term of this patent is extended or adjusted under 35 U.S.C. 154(b) by 0 days.

(21) Appl. No.: 09/745,450

(22) Filed: Dec. 26, 2000

(51) Int. Cl.[7] .................................................. H03L 7/00
(52) U.S. Cl. ........................ 331/17; 331/1 A; 331/18; 331/DIG. 2; 331/25; 327/156; 327/159; 327/147
(58) Field of Search ..................... 331/17, 1 A, DIG. 2, 331/18, 25; 375/376; 327/147, 148, 149, 156, 159

(56) References Cited

U.S. PATENT DOCUMENTS

| 4,007,429 A | * | 2/1977 | Cadalora et al. ............... 331/17 |
| 4,920,320 A | * | 4/1990 | Matthews ............... 331/17 XY |
| 5,748,569 A | | 5/1998 | Teodorescu et al. ......... 368/118 |
| 6,097,777 A | * | 8/2000 | Tateishi et al. ............. 375/376 |
| 6,259,328 B1 | * | 7/2001 | Wesolowski .................. 331/14 |

* cited by examiner

Primary Examiner—Arnold Kinkead
(74) Attorney, Agent, or Firm—Harrity & Snyder, L.L.P.

(57) ABSTRACT

A multi-loop phase lock loop (PLL) contains multiple loop filters, each having different bandwidths. The multi-loop PLL receives one of multiple high-frequency clock signals as an input. A phase detector outputs a signal, based on the phase difference between the high-frequency clock signal and a feedback signal to the loop filters. A voltage controlled oscillator generates an output clock signal based on signals received from the loop filters. During a clock switch over sequence between the multiple high-frequency input clock signals, the multi-loop PLL uses one of its loop filters with a wide bandwidth to quickly lock the input clock signal. Once the clock signal is locked, a narrower bandwidth loop filter in the PLL is then used to reduce jitter in the locked signal.

21 Claims, 3 Drawing Sheets

MULTI-LOOP PHASE LOCK LOOP FOR CONTROLLING JITTER IN A HIGH FREQUENCY REDUNDANT SYSTEM

BACKGROUND OF THE INVENTION

A. Field of the Invention

The present invention relates generally to timing circuitry, and more particularly, to circuitry for high frequency clock alignment and switching.

B. Description of Related Art

Synchronous circuits are circuits that perform operations in step with a clock signal. For example, a clock source can be used in conjunction with a communication bus to provide a synchronous communications link between a sourcing device and one or more receiving devices. In a source synchronous communications link, the source device provides a source clock signal that the receiving device uses to synchronize the reading of data from the communications link.

Designs for mission critical systems must provide reliability. Redundancy can be built into a mission critical system to increase reliability. For example, redundant timing signals may be used in high performance telecommunications systems, such as high performance network routers. Such systems may include systems that have redundant, high frequency clock signals that receive and transmit data over optical carriers such as those conforming to the OC-48 or OC-192 synchronous optical network standard. In these systems, when an error is detected in the active clock, the redundant clock is switched to take over the role of the active clock.

Problems can arise when switching between high-frequency primary and redundant clock signals and when initially turning on the high-frequency clock signal. The high frequency of the clocks can make it difficult for the receiving system to obtain acquisition ("lock") of the newly activated clock, because of the low phase-noise requirement of the high frequency clocks. Additionally, the high-frequency clock must filter jitter from the input reference clock signal. Finally, switch-over between the two clock signals may cause glitches.

Accordingly, there is a need in the art to be able quickly lock onto a new clock signal or a newly switched high-frequency clock signal while reducing jitter and glitches caused by clock signal cross-over.

SUMMARY OF THE INVENTION

Systems and methods consistent with the present invention address this and other needs through the use of a multi-loop phase locked loop.

More particularly, a first aspect of the present invention is directed to a redundant clock system comprising a number of elements, including input clock signals and a multiplexer connected to receive the input clock signals and a control signal. The multiplexer outputs one of the input clock signals as a reference clock signal in response to the control signal. Additionally, a phase locked loop circuit is connected to receive the reference clock signal from the multiplexer. The phase locked loop circuit includes a first loop filter and a second loop filter. The first loop filter has a first bandwidth for initially locking onto the reference clock signal. A second loop filter has a second bandwidth, less than the first bandwidth. The second loop filter corrects for jitter in the reference clock signal after the first loop filter has locked onto the reference clock signal.

A second aspect of the present invention is directed to a circuit for removing jitter from a high frequency clock signal. The circuit includes a lock detection component, a first loop filter, a second loop filter, a switch, and a voltage controlled oscillator. The first loop filter receives a signal based on phase differences between the reference clock signal and the feedback clock signal and has a first predetermined bandwidth. A second loop filter receives the signal based on phase differences between the reference clock signal and the feedback clock signal and has a second predetermined bandwidth lower than the first predetermined bandwidth. The switch selects, based on the lock detection signal from the lock detection component, either the first loop filter or the second loop filter as the active loop filter.

A third aspect of the present invention is directed to a method of generating a clock signal based on one of a number of input clock signals. The method includes selecting one of the input clock signals as a reference signal and generating a first signal based on phase differences between the reference clock signal and a feedback signal. First and second loop filters process the first signal. The first loop filter is designed to lock the feedback signal to a reference clock signal. The second loop filter reduces jitter in the locked signal.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims and equivalents.

As described herein, a multi-loop phase lock loop (PLL), containing multiple phase locked loop filters, each having different bandwidths, receives one of multiple high-frequency clock signals as an input. During clock start-up or upon a clock switch over sequence, the multi-loop PLL uses the wide bandwidth loop to quickly lock the input clock signal. Once the clock signal is locked, a narrower bandwidth loop filter in the PLL can then reduce jitter in the locked signal. Alternatively, during a clock switch over, if the new clock signal is enough in phase to the old clock signal, the multi-loop PLL may immediately use the narrow band PLL to reduce jitter.

Figure 1:
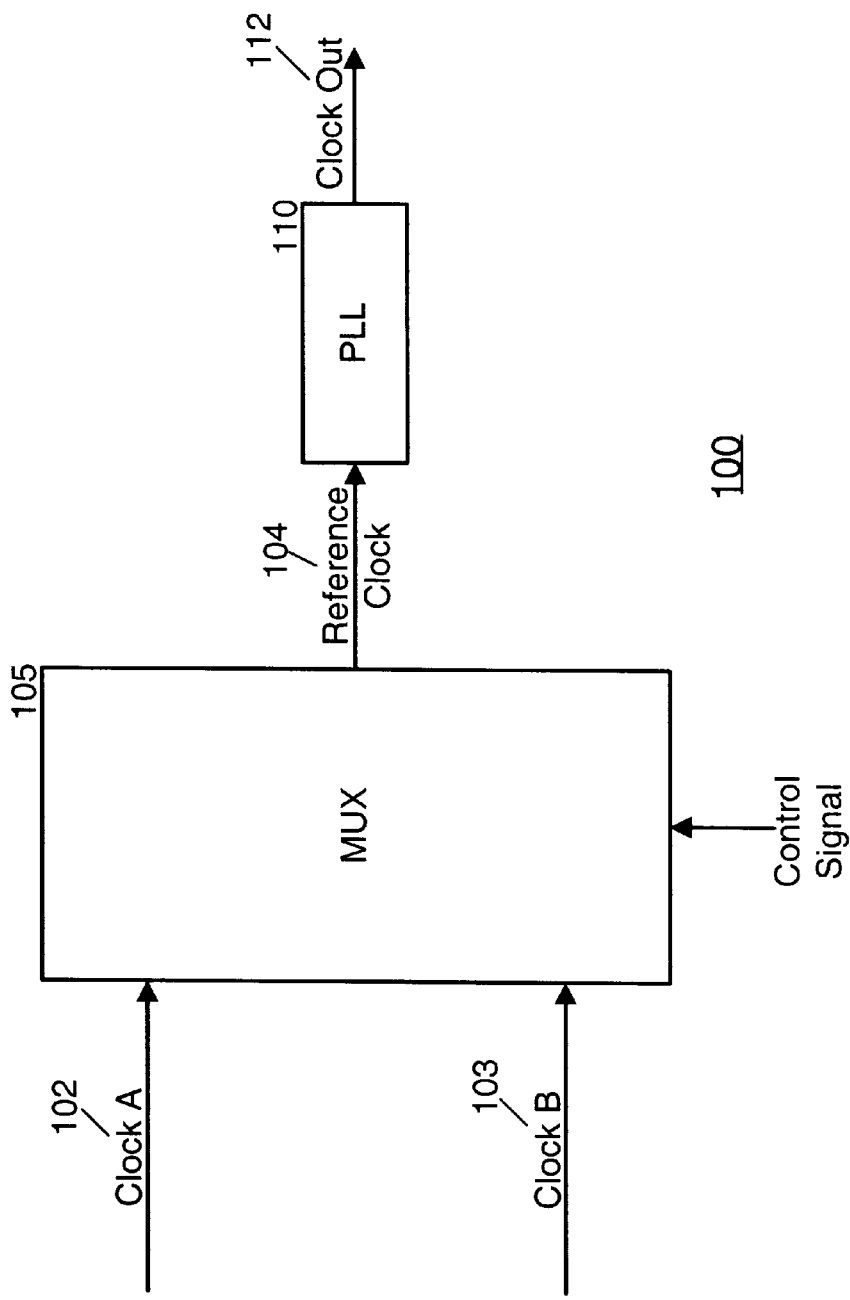
FIG. 1 is a block diagram illustrating, at a high level, a redundant clock system.

FIG. 1 is a block diagram illustrating, at a high level, a redundant clock system. System 100 includes a multiplexer 105 and a PLL circuit 110. System 100 receives two clock signals, labeled as "Clock A" 102 and "Clock B" 103. The multiplexer 105 selects one of the two clock signals 102 and 103 based on a control signal. The selected clock signal is passed to PLL circuit 110, as a reference clock signal 104, and, after processing, output as "Clock Out" 112. The input clock signals 102 and 103 may be, for example, clock signals of 19.44 MHz and the output clock signal 112 may be a 622.08 MHz signal. Input clock signal 102 and 103 may be based on a highly accurate clock source such as a SONET stratum clock type.

Multiplexer 105, in addition to merely selecting one of clocks 102 or 103 to output as reference clock 104, may pre-process the selected clock signal to bring it more into phase with the old clock signal. In this situation, it may be easier for PLL 110 to lock onto the new clock signal. For example, multiplexer 105 may include delay lines that implement a variable amount of delay in input signals 102 or 103. During clock switch over, multiplexer 105 may then introduce enough delay into the new clock signal to phase align the new clock signal to the old clock signal.

In general, a PLL is an electronic circuit that controls an oscillator so that it maintains a constant phase angle relative to a reference signal. PLL circuit 110 performs this function on reference clock 104 to thereby reduce jitter in clock out signal 112. Additionally, when reference clock 104 is being switched over from clock A 102 to clock B 103 (or vice versa), or reference clock 104 is newly introduced to the system, PLL circuit 110 can quickly lock onto the newly switched clock signal and then begin high precision jitter reduction.

Figure 2:
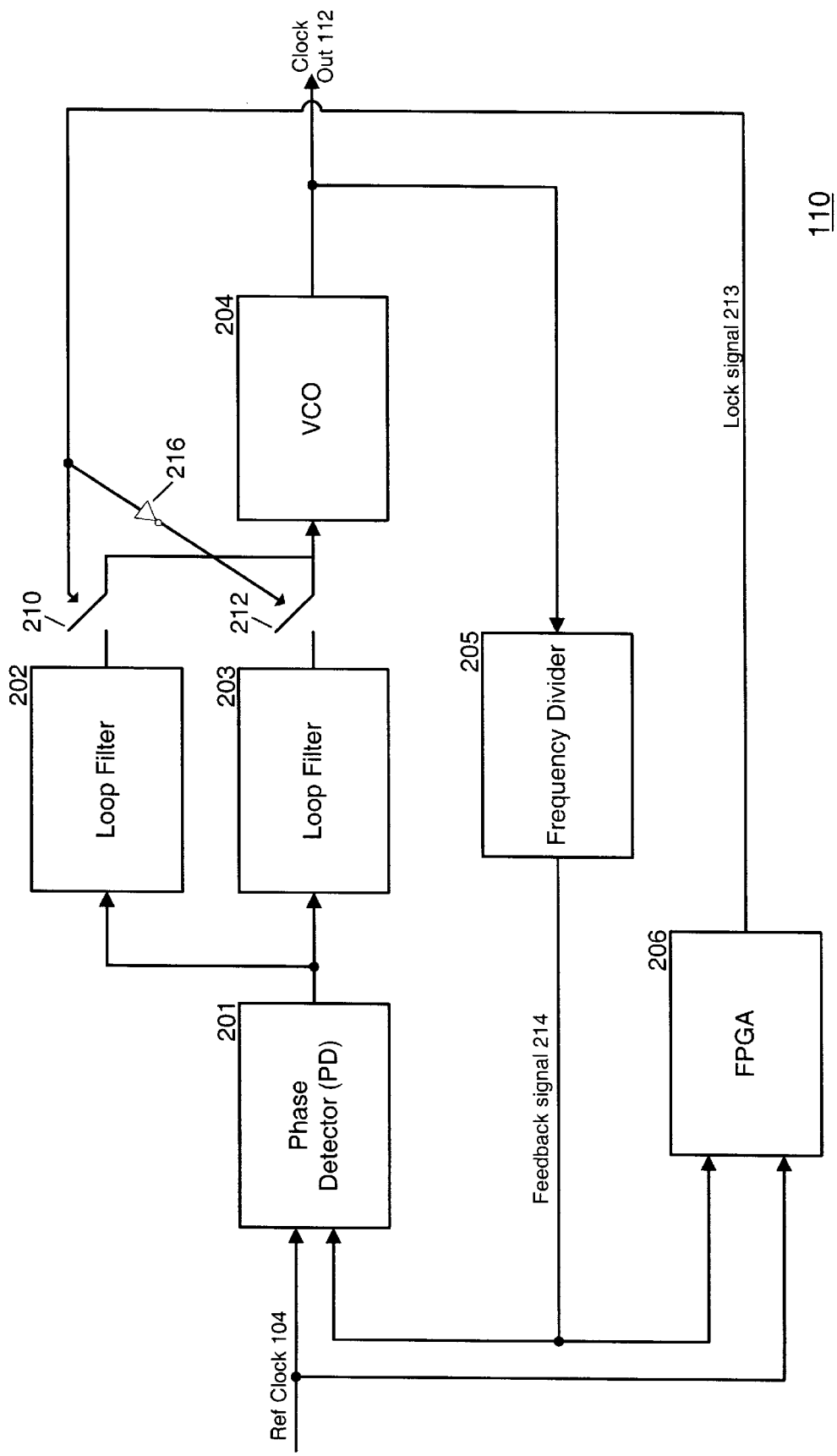
FIG. 2 is a block diagram illustrating an exemplary implementation of a phase lock loop component consistent with the present invention.

FIG. 2 is a block diagram illustrating, in more detail, an exemplary implementation of PLL circuit 110. The input clock signal, reference clock 104, is received by phase detector 201. Phase detector 201 also receives the output of frequency divider 205, which reduces the frequency of clock out signal 112 by a predetermined factor (such as 32). Phase detector 201 outputs a signal representing the difference in phases between its two input signals. This phase difference signal is fed to a first loop filter 202 and a second loop filter 203. Through switches 210 and 212, the output of the first or second loop filters 202 and 203 is selected and transmitted to voltage-controlled-oscillator (VCO) 204. The output of VCO 204 is the output signal 112, which is also transmitted back to the input of frequency divider 205. FPGA (field programmable gate array) 206 receives the reference clock signal 104 and the feedback clock signal 214, and outputs a lock signal 213 to switches 210 and 212.

Phase detector 201 may include a phase detection mechanism that outputs a first state (e.g., logic high) when reference clock signal 104 and feedback signal 214 have the same logic state, and outputs a second state (e.g., logic low) when the these two signals are of different values. In this manner, the output of phase detector 201 is an indication of the phase difference between the two input clock signals 104 and 214.

VCO 204 may include a surface acoustic wave (SAW) based VCO that generates clock out signal 112 based on its input control voltage. Clock out signal 112 can have a frequency that is a multiple of the reference clock frequency. For example, clock out signal 112 may be a 622.08 MHz signal and reference clock 104 may be a 19.44 MHz signal. In this situation, the multiplying factor is 32. Other clock frequencies and multiplying factors may be used. Frequency divider 205 may be accordingly constructed to reduce the frequency by a factor of 32 so that feedback signal 214 and reference clock signal 104 are the same frequency. A SAW based VCO is desirable as it tends to have a high "Q" value. SAW based VCOs are known in the art and will, therefore, not be described further herein.

FPGA (field programmable gate array) 206 generates lock signal 213 in response to feedback signal 214 and reference clock 104. In particular, when reference clock 104 has been acquired by feedback signal 214 (i.e., it is locked), FPGA 206 activates lock signal line 213. Circuits for generating signals based on a lock detection comparison are well known in the art, and thus FPGA 206 will not be described further herein.

Narrow bandwidth PLLs provide better phase noise characteristics than wider bandwidth PLLs when in the presence of noisy reference clocks. Wider bandwidth PLLs, however, have better acquisition and tracking characteristics. PLL circuit 110, at different times, may effectively function as both a narrow bandwidth PLL and a wide bandwidth PLL. Initially, PLL 110 acts as a wider bandwidth PLL. When the clock signal is locked, PLL 110 begins to operate as a narrow bandwidth PLL. In this manner, PLL 110 can quickly lock and begin to reduce phase noise in the input reference clock signal.

More particularly, loop filter 202 may include a wide band loop filter (e.g., a 1 kHz bandwidth filter) and loop filter 203 may include a narrow band loop filter (e.g., a 17 Hz bandwidth filter). Lock signal 213 controls the operational state of switches 210 and 212 so that the switches are in opposite states (illustrated in FIG. 2 by inverter 216 leading to the control node of switch 212). In operation, FPGA 206 initially outputs a lock signal 213 that indicates that a signal lock is not found (e.g., a logic low value), which causes switch 210 to connect loop filter 202 to VCO 204. When FPGA 206 determines that the feedback signal 214 and the reference clock 104 are locked, FPGA 206 changes the state of the lock signal 213, causing switches 210 and 212 to reverse state. Accordingly, the narrow band loop filter, loop filter 203, is connected to VCO 204 and the wide band loop filter, loop filter 202, is disconnected from VCO 204. Narrow bandwidth loop filter 203 then functions with VCO 204 to generate a low jitter clock out 112 signal.

The above-discussed switching between loop filters 202 and 203 may be implemented whenever reference clock signal 104 is initially turned on. In this situation, the new reference clock signal 104 will generally be difficult for the narrow band loop filter 203 to lock to the new signal. Accordingly, FPGA 206 will indicate a lack of lock, and the wider band loop filter 202 will begin to operate. During switch-over between one of redundant clock signals 102 or 103, however, the new reference clock signal 104 may already be close enough to the old clock signal so that lock may be continuously maintained (this is particularly true when multiplexer 105 preprocesses the switched signal using variable length delay lines to remove phase difference.) In this situation, FPGA 206 will continue to maintain a positive lock signal 213, and narrow band filter 203 will continuously operate.

Figure 3:
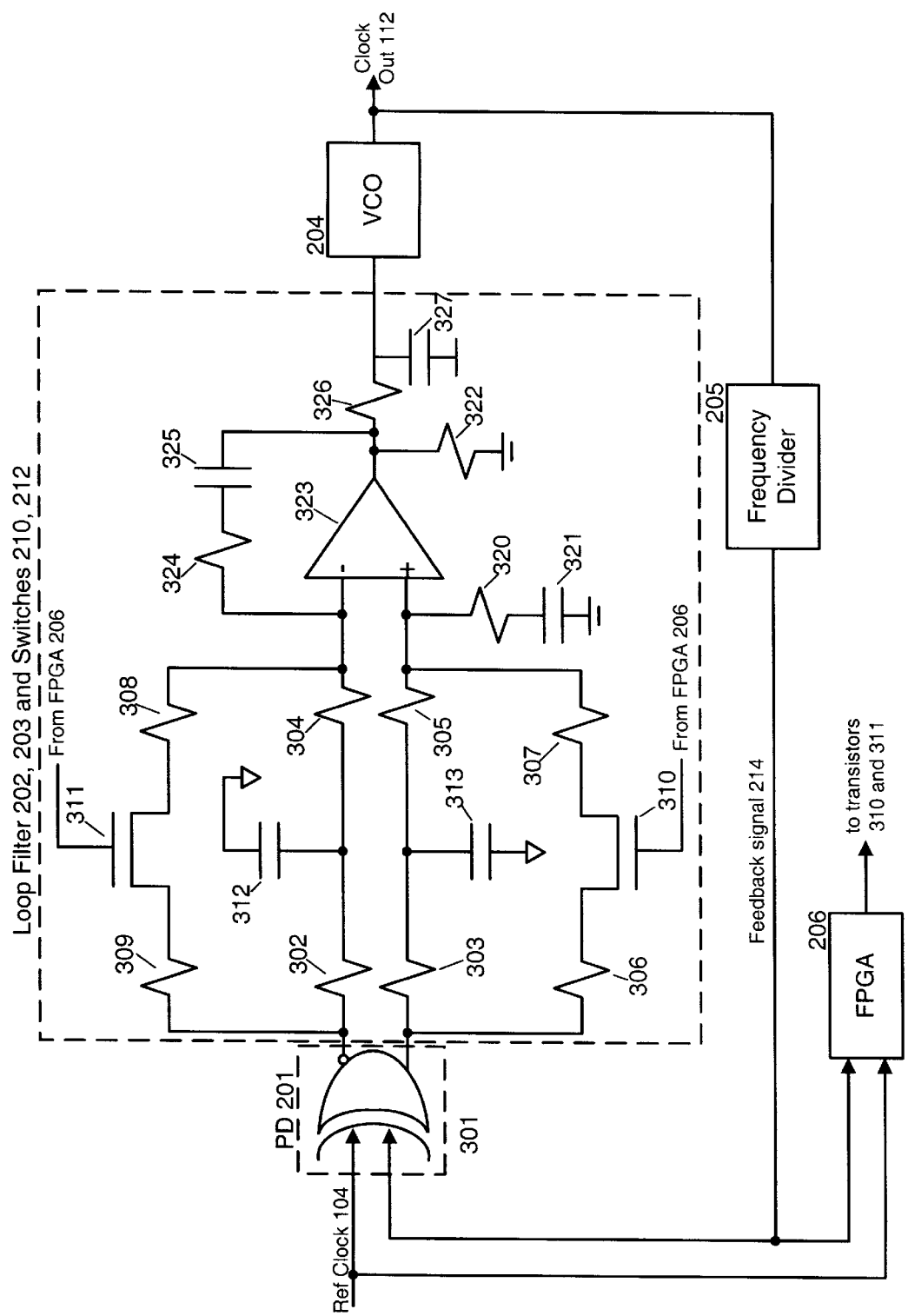
FIG. 3 is an electrical diagram illustrating an exemplary implementation of loop filters and a phase detector consistent with the present invention.

FIG. 3 is an electrical diagram illustrating an exemplary construction of loop filters 202–203 and phase detector 201.

Loop filters 202 and 203 are shown conceptually in FIG. 2 as two independent elements switched in and out by two distinct switches 210 and 212. However, as shown in the actual physical implementation of FIG. 3, loop filters 202 and 203 may be implemented as a single combined circuit that uses a single switch implemented by transistors 310 and 311.

Phase detector 201 may be implemented as exclusive-OR (XOR) gate 301. Two complimentary outputs are taken from XOR gate 301, which are eventually fed into the input of differential amplifier 323. An XOR gate has the property that it outputs an active value when its input signals have different values—that is, when the two input clock signals 104 and 214 are out of phase with one another. In general, an XOR based phase detector may have more difficulty locking than conventional phase-frequency detectors. However, an XOR gate has less deadband and therefore less overall noise than a conventional phase-frequency detector. Because XOR gate 301 is used in conjunction with loop filters 202 and 203, the fact that XOR gate 301 may have more difficulty locking the signal is less of an issue, because the circuit has multiple bandwidth loops and can pick an appropriate bandwidth setting to help achieve lock.

Loop filter 202 may include resistors 306–309 connected in series to differential amplifier 323. The pairing of resistors 306, 307 and 308, 309, as opposed to using a single resistor in place of pairs 306, 307 or 308, 309, isolates unwanted parasitic capacitance from transistors 310 and 311 from the narrow loop circuit, respectively. Transistors 310 and 311 either connect or disconnect loop filter 202 from circuit 110 based on the value of lock signal line 213. Before FPGA 206 finds a signal lock, lock signal line 213 closes transistors 310 and 311, connecting loop filter 202 to circuit 110. When FPGA 206 detects a signal lock, it inverts the lock signal line 213, which disconnects loop filter 202 from circuit 110 and allows the narrow band loop filter 203 to function. The narrow band loop filter 203 includes the serially-connected resistor pairs 302, 304 and 303, 305. Filtering capacitors 312 and 313 are placed between each pair of resistors and its power supply.

Additionally, as shown in FIG. 3, differential amplifier 323 is surrounded by a number of circuit elements, including, for example: resistor 320 and capacitor 321 connected in series to one input of differential amplifier 323; resistor 324 and capacitor 325 connected in series to the second input of differential amplifier 323 and to the output of differential amplifier 323; resistor 322 connected between the output of differential amplifier 323 and ground; resistor 326, connected between the output of differential amplifier 323 and VCO 204; and capacitor 327, connected between resistor 326 and VCO 204.

As described above, a PLL circuit 110 effectively uses multiple loop filters to handle clock acquisition and jitter control during switching between high frequency clock sources and upon initial application of a high frequency clock source. Although the PLL circuit 110 has been described as receiving one of two reference clock signals, one of ordinary skill in the art will recognize that any number of redundant reference clock signals could be used. Additionally, PLL circuit 110 could be constructed with greater than two loop filters. For example, two wideband filters, one wider than the other, could be used to lock onto the reference signal by stepping down from the widest bandwidth filter to the narrower wideband filter.

The resistors and capacitors shown in FIG. 3 could be set to any number of different values to obtain appropriate operation of PLL circuit 110. In general, the resistor and capacitor components shown in FIG. 3 are determined by the bandwidth and phase margin of the PLL. Since the VCO represents a pole at the origin, and the op-amp is configured as an integrator, a zero should be created so that the slope of the transfer function is falling at −20 dB per decade at unity gain. By adjusting the phase margin at unity gain, the responsivity of the loop can be adjusted from underdamped to overdamped response. In this design, given that multiple PLLs can be configured in tandem, so as to limit jitter peaking, an overdamped response is desirable.

The foregoing description of preferred embodiments of the present invention provides illustration and description, but is not intended to be exhaustive or to limit the invention to the precise form disclosed. Modifications and variations are possible in light of the above teachings or may be acquired from practice of the invention.

Although described as being primarily implemented in hardware, the present invention may be embodied in hardware and/or software (including firmware, resident software, micro-code, etc.). Furthermore, portions of the present invention may take the form of a computer program product on a computer-usable or computer-readable storage medium having computer-usable or computer-readable program code embodied in the medium for use by or in connection with an instruction execution system.

The scope of the invention is defined by the claims and their equivalents.

What is claimed is:

1. A circuit for removing jitter from a high frequency clock signal comprising:

a first input clock signal line configured to receive a first input clock signal;

a second input clock signal line configured to receive a second input clock signal;

a multiplexer component configured to receive the first input clock signal and the second input clock signal and process at least one of the first and second input clock signals to bring the first and second input clock signals into phase with one another, the multiplexer component outputting one of the processed first and second input clock signals as a reference clock signal;

a lock detection component connected to receive the reference clock signal and a feedback clock signal, the lock detection component detecting when the feedback clock signal is locked to the reference clock signal and outputting a lock detection signal in response to the detection;

a first loop filter configured to receive a signal based on phase differences between the reference clock signal and the feedback clock signal, the first loop filter having a first predetermined bandwidth;

a second loop filter configured to receive the signal based on phase differences between the reference clock signal and the feedback clock signal, the second loop filter having a second predetermined bandwidth lower than the first predetermined bandwidth;

a switch configured to select the first loop filter as an active loop filter when the lock detection signal indicates that the feedback clock signal is not locked to the reference clock signal and the second loop filter as the active loop filter when the lock detection signal indicates that the feedback clock signal is locked to the reference clock signal; and a voltage controlled oscillator connected to an output of the first and second loop filters, the voltage controlled oscillator producing a clock out signal based on signals from the first and second loop filters.

2. The circuit of claim 1, wherein the clock out signal is used to derive the feedback clock signal.

3. The circuit of claim 1, wherein the lock detection signal indicates signal lock in response to the first loop filter locking the feedback clock signal to the reference clock signal.

4. The circuit of claim 3, wherein the second loop filter operates to reduce jitter in the high frequency clock signal.

5. The circuit of claim 1, wherein the voltage controlled oscillator includes a surface acoustic wave voltage controlled oscillator.

6. The circuit of claim 1, further comprising
a frequency divider configured to receive the clock out signal and output the feedback clock signal, the frequency divider generating the feedback clock signal by reducing the frequency of the clock out signal by a predetermined factor.

7. The circuit of claim 6, wherein the reference clock signal has a frequency of 19.44 MHz and the clock out signal has a frequency of 622.08 MHz.

8. The circuit of claim 7, wherein the frequency divider reduces the frequency of the clock out signal by a factor of 32.

9. A redundant clock system comprising:
a plurality of input clock signal lines for carrying respective redundant input clock signals;
a multiplexer connected to receive the plurality of input clock signals and a control signal and process at least one of the plurality of input clock signals to bring the input clock signals into phase with one another, the multiplexer outputting one of the plurality of input clock signals as a reference clock signal in response to the control signal; and
a phase locked loop circuit connected to receive the reference clock signal from the multiplexer, the phase locked loop circuit including
a first loop filter, having a first bandwidth, for initially locking onto the reference clock signal;
a second loop filter, having a second bandwidth less than the first bandwidth, for correcting for jitter in the reference clock signal after the first loop filter has locked onto the reference clock signal; and
a lock detection component connected to receive the reference clock signal and a feedback clock signal, the lock detection component detecting when the feedback clock signal is locked to the reference clock signal and outputting a lock detection signal in response, to the detection.

10. The redundant clock system of claim 9, wherein the phase lock loop circuit further includes:
a voltage controlled oscillator connected to an output of the first and second loop filters, the voltage controlled oscillator producing a clock out signal based on signals from the first and second loop filters, the clock out signal being used to derive the feedback signal.

11. The redundant clock system of claim 10, wherein the phase lock loop circuit further includes:
a switch configured to select the first loop filter as an active loop filter when the lock detection signal indicates that the feedback clock signal is locked to the reference clock signal and the second loop filter as the active loop filter when the lock detection signal indicates that the feedback clock signal is not locked to the reference clock signal.

12. The redundant clock system of claim 11, wherein the lock detection component detects when the feedback clock signal is locked to the reference clock signal in response to initial application of the reference clock signal.

13. The redundant clock system of claim 10, wherein the voltage controlled oscillator includes a surface acoustic wave voltage controlled oscillator.

14. The redundant clock system of claim 13, wherein the phase lock loop circuit further includes:
a frequency divider configured to receive the clock out signal and output the feedback clock signal, the frequency divider generating the feedback clock signal by reducing the frequency of the clock out signal by a predetermined factor.

15. The redundant clock system of claim 14, further including an exclusive-OR gate connected to receive the reference clock signal and the feedback clock signal and configured to generate an input to the first and second loop filters based on phase differences between the reference clock signal and the feedback clock signal.

16. The redundant clock system of claim 15, wherein the reference clock signal has a frequency of 19.44 MHz, the clock out signal has a frequency of 622.08 MHz, and the frequency divider reduces the frequency of the clock out signal by a factor of 32.

17. The circuit of claim 1, wherein the first and second loop filters are differential filters.

18. The circuit of claim 1, further comprising:
an exclusive-OR gate connected to receive the reference clock signal and the feedback clock signal and configured to generate the signal based on phase differences between the reference clock signal and the feedback clock signal.

19. The system of claim 9, wherein the first and second loop filters are differential filters.

20. The circuit of claim 1, wherein the multiplexer component includes:
delay lines configured to process the at least one of the first and second input clock signals by introducing delay into the at least one of the first and second input clock signals.

21. The system of claim 9, wherein the multiplexer includes:
delay lines configured to process the at least one of the plurality of input clock signals by introducing delay into the at least one of the plurality of input clock signals.

* * * * *